United States Patent [19]
Kovacs et al.

[11] Patent Number: 5,646,968
[45] Date of Patent: Jul. 8, 1997

[54] DYNAMIC PHASE SELECTOR PHASE LOCKED LOOP CIRCUIT

[75] Inventors: Janos Kovacs, Andover; Ronald Kroesen, Harvard; Kevin McCall, Leominster, all of Mass.

[73] Assignee: Analog Devices, Inc., Norwood, Mass.

[21] Appl. No.: 560,013

[22] Filed: Nov. 17, 1995

[51] Int. Cl.$^6$ .................................................. H03D 3/24
[52] U.S. Cl. .......................... 375/375; 375/376; 327/158; 327/159; 331/11; 331/25; 331/57
[58] Field of Search .................................... 375/371–373, 375/375, 376, 360, 362; 327/156–159; 331/1 R, 17, 18, 25, 11, 1 A, 27, 57, 187, 14, 135

[56] References Cited

U.S. PATENT DOCUMENTS

| | | | |
|---|---|---|---|
| 4,672,447 | 6/1987 | Moring et al. | 331/1 R |
| 4,802,009 | 1/1989 | Hartmeier | 375/378 |
| 4,890,299 | 12/1989 | Dolivo et al. | 375/376 |
| 5,126,691 | 6/1992 | Mijuskovic et al. | 331/57 |
| 5,331,294 | 7/1994 | Watanabe et al. | 331/57 |
| 5,502,750 | 3/1996 | Co et al. | 375/372 |

OTHER PUBLICATIONS

32Mb/s Read channel electronics, AD899 Preliminary datasheet Analog devices Inc. confidential, Version 0.5.4.
Welland et al, "Implementation of a Digital Read/Write Channel with EEPR4 Detection", IEEE Transactions on Magnetics, vol. 31, No. 2, pp. 1180–1185.

*Primary Examiner*—Stephen Chin
*Assistant Examiner*—Don Vo
*Attorney, Agent, or Firm*—Iandiorio & Teska

[57] ABSTRACT

A dynamic phase selector phase locked loop circuit includes: an A/D converter for receiving an input to be sampled; a phase detection circuit for determining the phase error between the input signal and a clock signal; a clock circuit, responsive to the phase detection circuit, for providing the clock signal to the A/D converter for timing the sampling of the input signal; the clock circuit including a delay circuit having a number of delay taps; and a phase selector circuit, responsive to the phase detection circuit, for initially gating the clock signals to the A/D converter from the clock circuit, and enabling one of the delay taps to dynamically adjust the phase of the clock signal and reduce the initial phase error.

11 Claims, 6 Drawing Sheets

DYNAMIC PHASE SELECTOR PHASE LOCKED LOOP CIRCUIT

FIELD OF INVENTION

This invention relates to an improved phase locked loop circuit which dynamically adjusts the initial phase of the sample clock and more particularly to such a circuit which is used for initial phase acquisition in data receivers in, for example, data transmission and recording systems.

BACKGROUND OF INVENTION

An important task of a data receiver in, for example, a read channel of a recording system or a data transmission system is to correctly, i.e. at the proper time/phase, sample the incoming data signal so that the signal may be properly decoded and processed.

Initially, when the receiver is activated to accept the incoming data signal the sampling rate of the receiver bears no relation to the data signal and there may be a large phase error between the receiver's sampling frequency and the frequency of the data signal. Thus, the sampling rate of the receiver must be initially brought into near synchronism with the frequency of the data signal so that its sampling rate is at most only nominally out of phase with the data signal. This is called initial phase acquisition. Then, relatively small phase corrections are made by a phase locked loop to lock onto the correct sampling phase so that the data receiver is sampling the incoming data signal at the correct phase. This is done to make small corrections as necessary for small differences between the rate of the received data signal and the sampling frequency of the data receiver.

It is important to quickly, initially adjust the sampling rate so that it is brought into close proximity to the rate of the received data signal. This allows the phase locked loop to then lock onto the rate of the data signal so that decoding and processing can begin. Any delay in this initial phase adjustment impedes the operation of the receiver.

One method for quickly initially synchronizing with the received signal uses a known training sequence which is transmitted/recorded prior to the actual data sequence of the received signal. This is done to train the receiver to sample at the appropriate sampling rate. A problem may occur during initial phase acquisition when the initial sampling phase occurs at a point half way between the desired sampling times. Then, the mechanism correcting the phase may reverse its direction of adjustment several times and the timing phase remains in the vicinity of this unstable equilibrium point for an extended period of time. Although this "hang-up" effect occurs rarely, the length of the training sequence must be chosen such that the system may still synchronize in that situation. The hang-up effect thus poses a major problem when fast and reliable synchronization is needed.

To overcome the problem of hang-up a procedure was developed to introduce a hysteresis effect which greatly diminishes the probability of reversals in the once chosen direction of timing phase adjustment period. This procedure is described in U.S. Pat. No. 4,890,299. However, this system still performs the initial phase acquisition relatively slowly.

Another technique used to perform the initial phase acquisition of the sampling phase which avoids the problem of hang-up is called zero phase start. With this technique it is necessary to detect the zero crossing of the incoming received signal to trigger the initial sampling of the phase locked loop so that it starts the sampling in phase or nearly in phase with the rate of the incoming signal. This system uses a comparator circuit which determines when there is a zero crossing in the incoming data signal. When the zero crossing is detected the voltage controlled oscillator (VCO) of the phase locked loop is enabled (previously disabled while not receiving data signals). The VCO then provides the clock signal to the analog to digital (A/D) converter to begin sampling at or near the appropriate point on the data signal. This method requires very precise timing, in that the A/D converter must be activated to begin sampling almost precisely at the proper sampling point on the data signal.

Due to delays in certain components, e.g. the A/D converter and comparator, the VCO must be enabled a predetermined amount of time before the data signal zero crossing to ensure proper sampling of the data signal. Also, since the frequency of the data signal is variable, the predetermined time before the zero crossing that the VCO must be enabled to enable proper sampling is variable. Therefore, complicated circuitry which determines the slope of the waveform of the data signal and accounts for delays in circuit components must be used to effect enabling of the VCO at the proper time to ensure initial sampling by the A/D converter at or near the correct points on the data signal. This circuity is also expensive and relatively slow. Moreover, it requires accurate calibration to ensure that the VCO is activated at the correct time given the delays of the components being used to start the sampling of the data signal by the A/D converter at the proper time.

SUMMARY OF INVENTION

It is therefore an object of this invention to provide a dynamic phase selector phase locked loop circuit which reduces initial phase acquisition time.

It is a further object of this invention to provide such a dynamic phase selector phase locked loop circuit which performs initial phase acquisition more simply than prior art phase acquisition techniques.

It is a further object of this invention to provide such a dynamic phase selector phase locked loop circuit which does not require calibration.

It is a further object of this invention to provide such a dynamic phase selector phase locked loop circuit which does not require the circuit component delay matching necessary with prior art initial phase acquisition techniques.

It is a further object of this invention to provide such a dynamic phase selector phase locked loop circuit which eliminates the "hang-up" problem of the prior art techniques.

This invention results from the realization that truly simpler and faster initial phase acquisition can be achieved with a phase locked loop circuit in which the initial phase error is used to adjust the delay tap selection in the delay circuit within the sample clock circuit to dynamically adjust the phase of the clock itself rather than requiting complicated external circuitry to accomplish zero phase start, or the other complicated, and relatively slow initial phase acquisition procedures.

This invention features a dynamic phase selector phase locked loop circuit. The circuit includes an A/D converter for receiving an input to be sampled and a phase detection circuit for determining the phase error between the input signal and a clock signal. There is a clock circuit, responsive to the phase detection circuit, for providing the clock signal to the A/D converter for timing the sampling of the input signal. The clock circuit includes a delay circuit having a number of delay taps. There is a phase selector circuit, responsive to the phase detection circuit, for initially gating the clock signals to the A/D converter from the clock circuit, and enabling one of the delay taps to dynamically adjust the phase of the clock signal and reduce the initial phase error.

In a preferred embodiment the phase detection circuit may include a phase detector and a loop filter. The clock circuit may be a voltage controlled oscillator. The delay circuit may include a total of 180° delay. The delay circuit may include a number of equal delay segments. There may be six delay segments with six taps spaced at 30° delay intervals. The phase selector circuit may include a gate circuit for gating the clock signals to the A/D converter. The phase selector circuit may include a first phase error storage circuit for storing the phase error by the phase detection circuit when the clock signals are initially gated to the A/D converter. The phase selector circuit may include a switching circuit responsive to the first phase error storage circuit for enabling one of the delay taps in the delay circuit to adjust the phase of the clock signal and reduce the initial phase error. The switching circuit may include a look-up table circuit. The phase selector circuit may include a timing generator for enabling the gate circuit to disable the output of the phase detector to the clock circuit.

BRIEF DESCRIPTION OF THE DRAWINGS

Other objects, features and advantages will occur to those skilled in the art from the following description of a preferred embodiment and the accompanying drawings, in which.

DISCLOSURE OF PREFERRED EMBODIMENT

Figure 1:
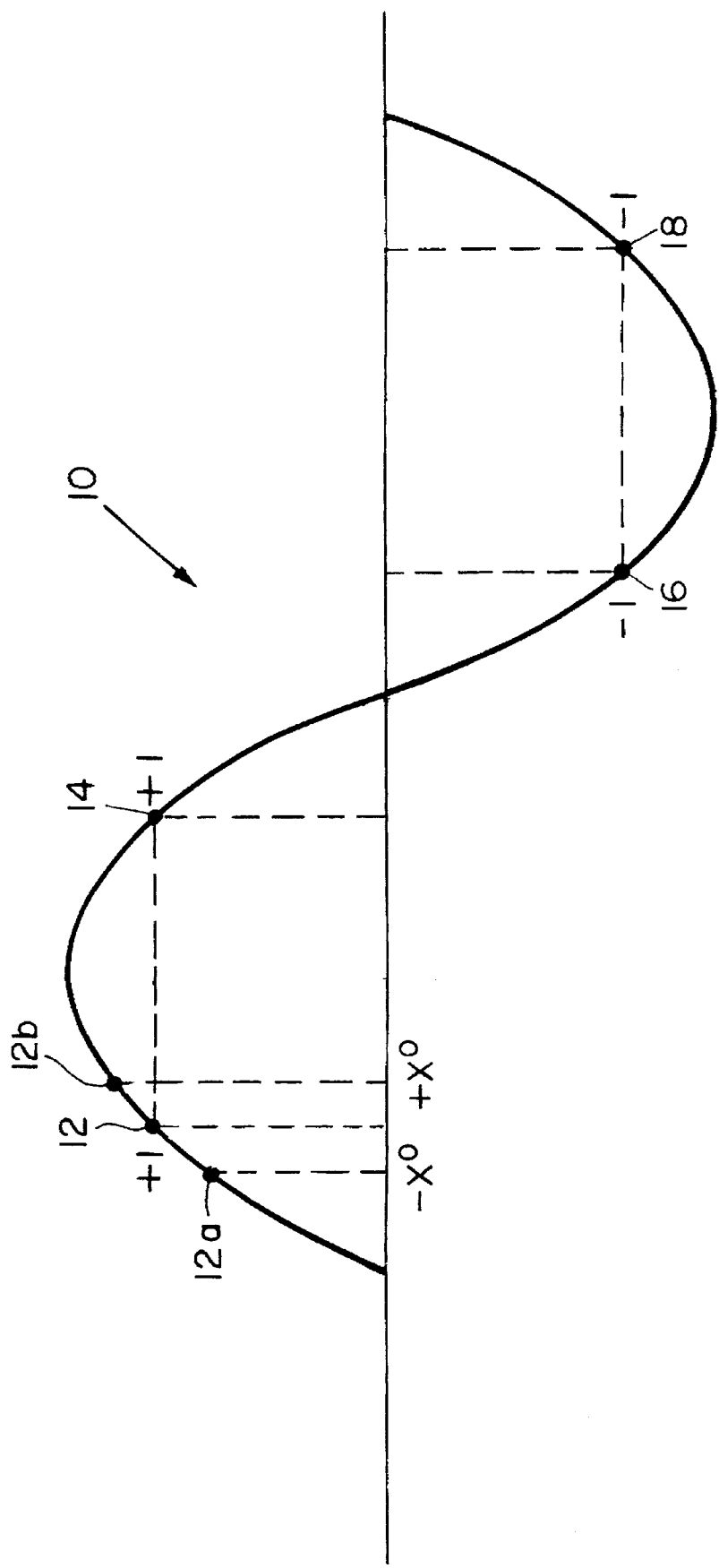
FIG. 1 is a plot of a waveform of a typical data signal received by the dynamic phase selector phase locked loop circuit according to this invention.

There is shown in FIG. 1 incoming data signal waveform 10 representative of a signal received by, for example, a read channel in a disk drive or a receiver section of a communications device, such as a transceiver. Proper in phase sampling of waveform 10 occurs at the +1 and −1 levels as indicated by sample points 12, 14, 16 and 18. If, however, the receiver is not sampling waveform 10 at the proper phase, such as at levels not equivalent to +1 as indicated by sample points 12a or 12b, an error in phase is detected and the sampling frequency is adjusted so that waveform 10 is properly sampled at sample point 12 and subsequent sample points 14, 16 and 18.

With sampling point 12a the sampling phase is too early resulting in a negative phase error of −X° which indicates that the sampling clock has to be advanced late. With sampling point 12b the sampling phase is too late resulting in a positive phase error of +X° which indicates that the sampling clock has to be receded early. Proper sampling is necessary for subsequent accurate decoding and processing of the data signal as is well known to those skilled in the art.

In order to accomplish proper in phase sampling of waveform 10, FIG. 1, a phase locked loop circuit is used to maintain the appropriate sampling phase. However, as described above, the initial phase acquisition (i.e. when the receiver is initially turned on or when turned on after periods of waiting for reception of data signals) is crucial to fast and accurate operation and may be accomplished in a number of ways. In the Background of Invention several prior art methods to initially bring the sampling phase of the data signal in close proximity to the correct sampling phase so that the normal operation of the phase locked loop can then be implemented are described. These prior art methods, however, are complicated, relatively slow, and often require initial calibration. Accordingly, the present inventors have developed a dynamic phase selector phase locked loop system 20, FIG. 2, which quickly and easily performs the initial phase acquisition.

After initial phase acquisition dynamic phase selector phase locked loop system 20 operates as a standard phase locked loop by receiving a data input signal on input line 22, such as the data input signal represented by waveform 10. This signal is sampled by analog to digital converter 24 and digital representations of each sample point of the signal are then provided to phase detector 26 which determines the amount of phase error, if any, in the sampling of the input signal by comparing the level of the input signal sampled to the correct, desired sampling levels, i.e. +1 or −1. Phase detector 26 then outputs a phase error signal to loop filter 28 which averages the output of phase detector 26 and provides an average phase error signal to voltage controlled oscillator (VCO) 30. VCO 30 adjusts its clock frequency output based on the average phase error signal to force A/D converter 24 to sample the data input single at the correct phase.

At certain times during operation, the data signal on input line 22 is gated by gate circuit 31 to prevent A/D converter 24 from receiving an input. Gate circuit 31 is enabled by a read gate signal supplied to it over line 32. This places system 20 in a waiting mode until more incoming dam signals are to be received. Simultaneously the read gate signal is supplied over line 33 to phase detector 26 to disable it and to frequency detector 34 to enable it. Frequency detector 34 receives a reference clock signal over line 36 which is very close to the correct data sampling rate and over line 38 it receives the output of VCO 30. This signal is compared to the reference clock signal and, if different, is adjusted accordingly. When frequency detector 34 is enabled auxiliary or waiting loop 40 which includes frequency detector 34, loop filter 28, and VCO 30 is established. This loop is maintained in operation at a frequency close to the correct sampling to keep loop 20 "warm" in the waiting mode.

When gate 31 receives a read gate signal over line 32 indicating an end to the waiting mode, gate 31 enables the delivery of data signals to A/D converter 24. Simultaneously, the read gate signal is provided over line 33 to disable frequency detector 34 and enable phase detector 26. This read gate signal on line 33 is also supplied to phase selector circuit 42 to activate the initial phase acquisition mode. Phase selector 42 provides a signal to gate circuit 43 causing it to temporarily prevent the output of VCO 30 from being provided to A/D converter 24. During normal phase locked loop operation and during the waiting mode, gate circuit 43 allows the output of VCO 30 to pass. The read gate signal provided over line 33 to phase selector 42 also tri-states loop filter 28 so that its output to VCO 30 is maintained at its last output level for the duration of the initial phase acquisition mode. The read gate signal also causes the output of phase detector 26 to be provided directly to phase selector 42.

When the first sample of the data signal is taken by A/D converter 24 and a phase error signal is generated by phase detector 26 it is then directly provided to phase selector circuit 42. Phase selector circuit 42 provides a delay tap adjustment signal to VCO 30 based on the phase error signal detected. This signal adjusts, if necessary, the delay tap selection of the delay line oscillator of VCO 30, described below, to cause a phase shift in the delay line oscillator corresponding to the initial phase error detected by phase detector 26. This enables VCO 30 to output a clock signal which at most is only nominally out of phase with the correct sample phase of the input data signal after only the first sample of the input data signal is taken. At this time, phase selector circuit 42 then reactivates loop filter 28, causes gate circuit 43 to pass the output of VCO 30, and prevents itself from receiving the output of phase detector 26 so that system 20 operates as a normal phase locked loop circuit with A/D converter 24, phase detector 26, loop filter 28 and VCO 30 operating in the loop.

Figure 2:
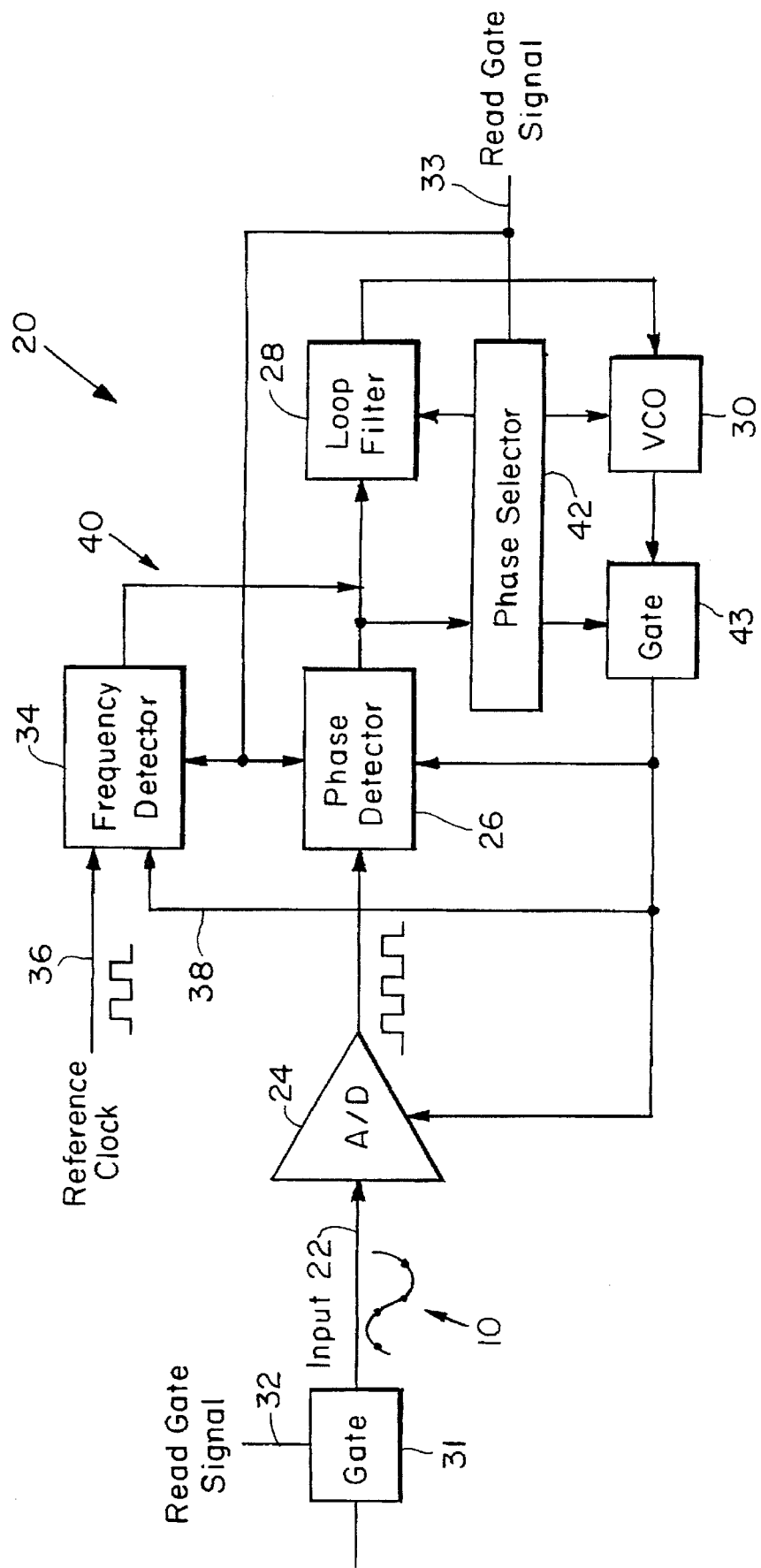
FIG. 2 is a schematic block diagram of a dynamic phase selector phase locked loop circuit according to this invention.
Figure 3:
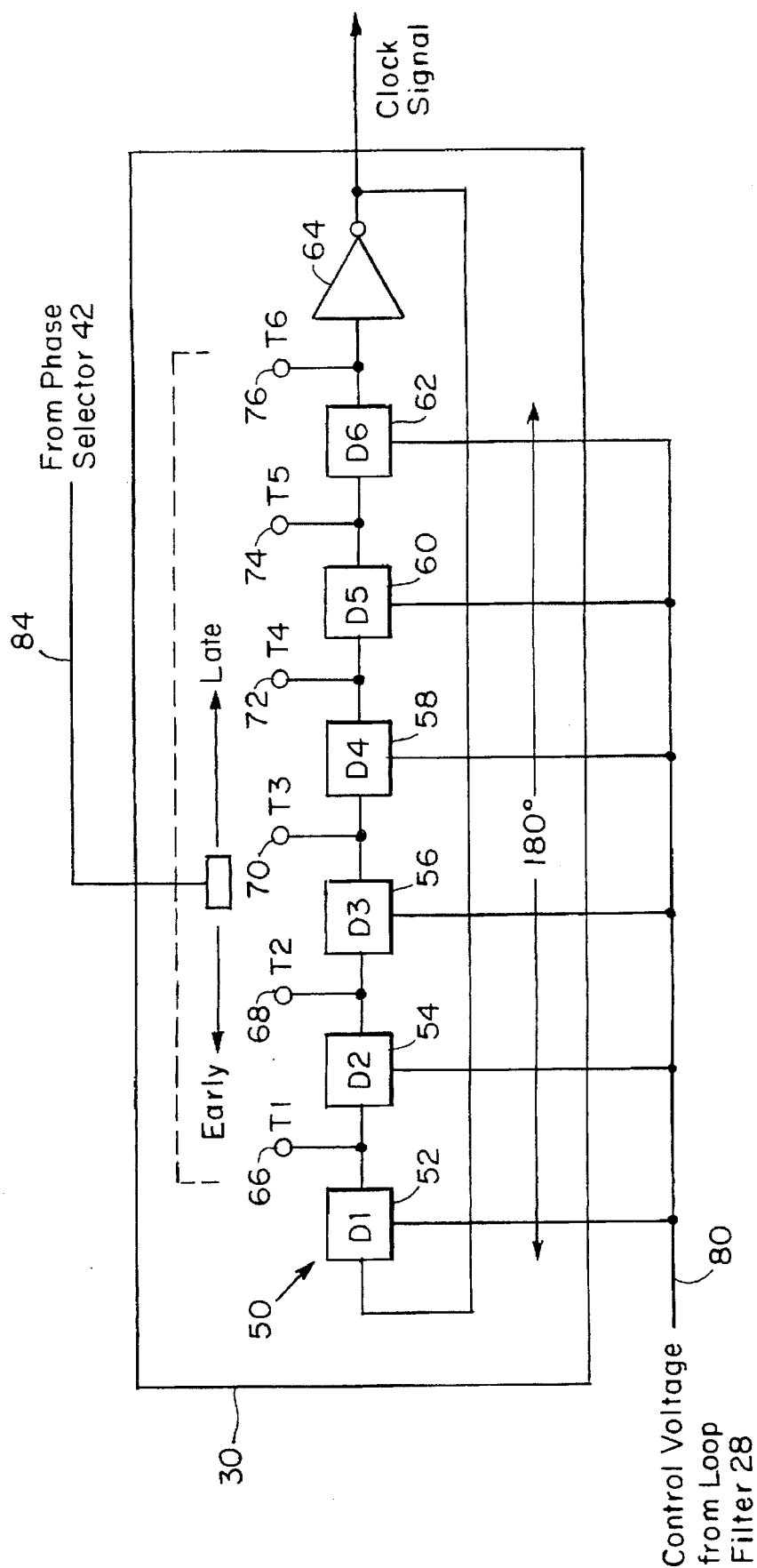
FIG. 3 is a schematic block diagram of the voltage controlled oscillator of FIG. 2.

A schematic block diagram of VCO 30 is shown in FIG. 3 to include a typical delay line oscillator 50 which includes a number of delay 52, 54, 56, 58, 60 and 62 and an inverter 64. At the output of the delays 52–62 are included delay taps 66, 68, 70, 72, 74 and 76. The output of oscillator 50 and VCO 30 is a clock signal which drives A/D converter 24, FIG. 2, to sample the data signal. Each delay tap, when selected, provides a clock signal output on line 78 of a different phase. That is, each tap when selected provides a phase shift in the output of VCO 30. Typically, the phase shift between each tap represents approximately 30°, however, a different number of delays could be used or different phase shifts between delays could be established. In this example there is a total of 180° phase shift from tap 66 to tap 76.

With prior art phase locked loop systems one tap is arbitrarily permanently selected when VCO 30 is fabricated. This permanently sets the initial phase of the clock signal output of the VCO. Then, initial phase acquisition must be accomplished by one of the complicated and slow prior art techniques described above. After initial phase acquisition, the average phase error signal from loop filter 28 supplied over line 80 is input to each of the delay circuits 52–62 and used to free tune the phase of the clock signal output from VCO 30 to match the correct sampling phase of the data signal.

With the present invention a single delay tap is not permanently selected, but rather, before each initial phase acquisition is made, a starting delay tap, typically tap 76 is selected. Then, when the first phase error signal from phase detector 26 is provided to phase selector circuit 42, FIG. 2, a dynamic delay tap adjustment is made based on the magnitude and polarity of the phase error signal to reduce the initial phase error to a nominal amount quickly and easily. This dynamic tap adjustment is accomplished when a delay tap adjustment signal is provided over line 84 to delay tap selector 82. For example, if the initial phase error were to be determined to be +62° (late), tap selector 82 would be shifted from its original tap position at tap 76 in the early direction, i.e. to the left, 60° to tap 72. This tap shift causes the output of the VCO 30 to be shifted 60° in the early direction so that the next phase error from phase detector 26 should be nominal, on the order of approximately +3°. This completes the initial phase acquisition and this nominal phase error can then be corrected by the normal phase locked loop operation of system 20 after phase selector circuit 42 is deactivated.

Figure 4:
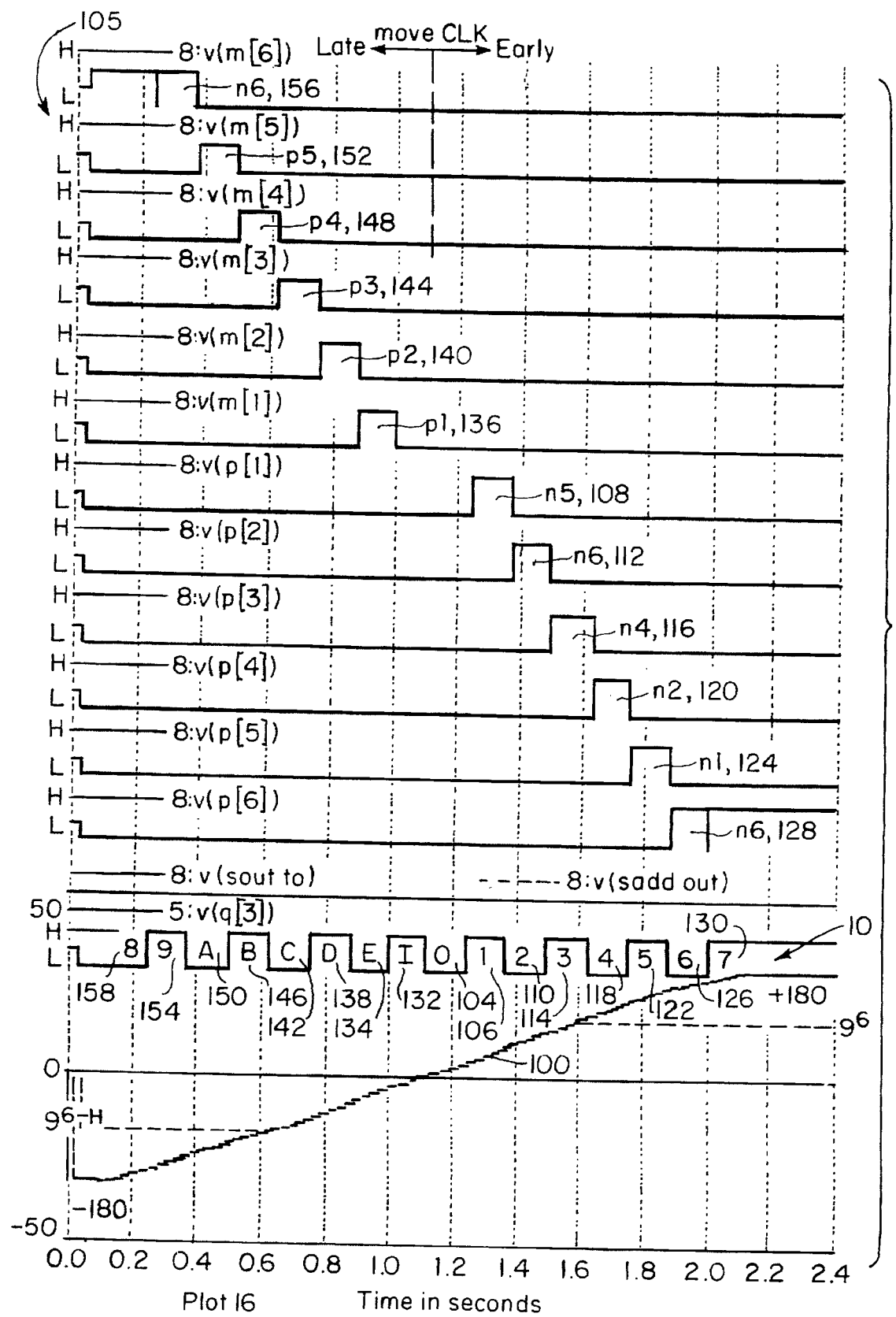
FIG. 4 is a depiction of the range of phase error signals, phase detector outputs and delay tap adjustment signals.

Waveform 100, FIG. 4, is a depiction of all the possible inputs to phase detector 26, FIG. 2, over the full range of phases from −180° to +180°. Various phase error signals corresponding to the various phases of waveform 100 output from phase detector 26 to phase selector circuit 42 are depicted by waveform 102. These phase error signals are typically six (6) bit digital words.

Phase error 104 represents the zero phase error and as illustrated by delay tap adjustment signal plot 105, no delay tap adjustment is made. This is because the phase error detected is only nominally different from the desired/correct sampling phase.

In contrast, when phase error signal 106, representing a positive (late) phase error, is provided to phase selector circuit 42 a delay tap adjustment signal 108 is output from phase selector circuit 42 causing delay tap selector switch 82 to change the original tap selection from tap 76 to the left to tap 74 to shift the phase of VCO 30 by −30° (early). When a positive phase error is detected this means that the sampling phase is too late and the clock has to be receded early. And, when a negative phase error is detected this means that the sampling phase is too early and the clock has to be advanced late.

Phase error signal 110 represents a larger positive phase error and results in the generation of delay tap adjustment signal 112 which causes the delay tap selector switch 82 to move the original tap position 76 to tap position 72 causing a −60° phase shift (early). Similarly, phase error signals 114, 118, 122, 126 and 130 cause phase selector 42 to output delay tap adjustment signals 116, 120, 124 and 128 to delay tap selector switch 82 of VCO 30. These represent tap adjustments from original tap 76 to taps 70, 68, 66, and tap 76, respectively. Phase error signals 126 and 130 both cause a full 180° clock phase inversion.

Phase error signal 132, representing a negative phase error, does not produce a delay tap adjustment signal because this phase error is sufficiently close to the desired sampling phase. However, negative phase errors signals 134, 138, 142, 146, 150, 154 and 158 cause the generation of delay tap adjustment signals 136, 140, 144, 148, 152 and 156, respectively, by phase selector circuit 42. These delay tap adjustment signals indicate that the sampling phase of the A/D converter 24 is too early and thus requires that the sampling be performed later to correct the sampling phase. For example, delay tap adjustment signal 136 requires that delay tap selector 82 change the original tap position 76 in the late direction (to the right) to tap 66 causing a +30° (late) phase change. Delay tap adjustment signals 140, 144, 148, 152 and 156 cause similar tap shifts to the right from tap 76 to taps 68, 70, 72, 74, and 76 effecting +60°, +90°, +120°, +150° and +180° (late) phase shifts, respectively.

Since the phase error resolution is approximately 22.5° as depicted by the sixteen phase error signals 104, 106, 110, 114, 118, 122, 126, 130, 132, 134, 138, 142, 146, 150, 154 and 158 of the phase error of waveform 100 and the VCO tap resolution is 30°, the phase errors 126, 130, 154 and 158 are all translated into 180° clock phase inversions.

The delay tap shift caused by phase selector circuit 42 occurs once in the initial phase acquisition mode to perform the initial phase acquisition by quickly and easily adjusting the phase of the VCO 30 to be within a nominal range of the desired sampling phase. After this tap adjustment which occurs after the first phase error detection signal is generated by phase detector 26, the phase selector circuit 42 is disabled and subsequent outputs of phase detector 26 are provided directly to loop filter 28. The output of loop filter 28 is then provided directly to VCO 30 to fine tune the outputs of delays 52–62 to nominally adjust the output phase of VCO 30.

Figure 5:
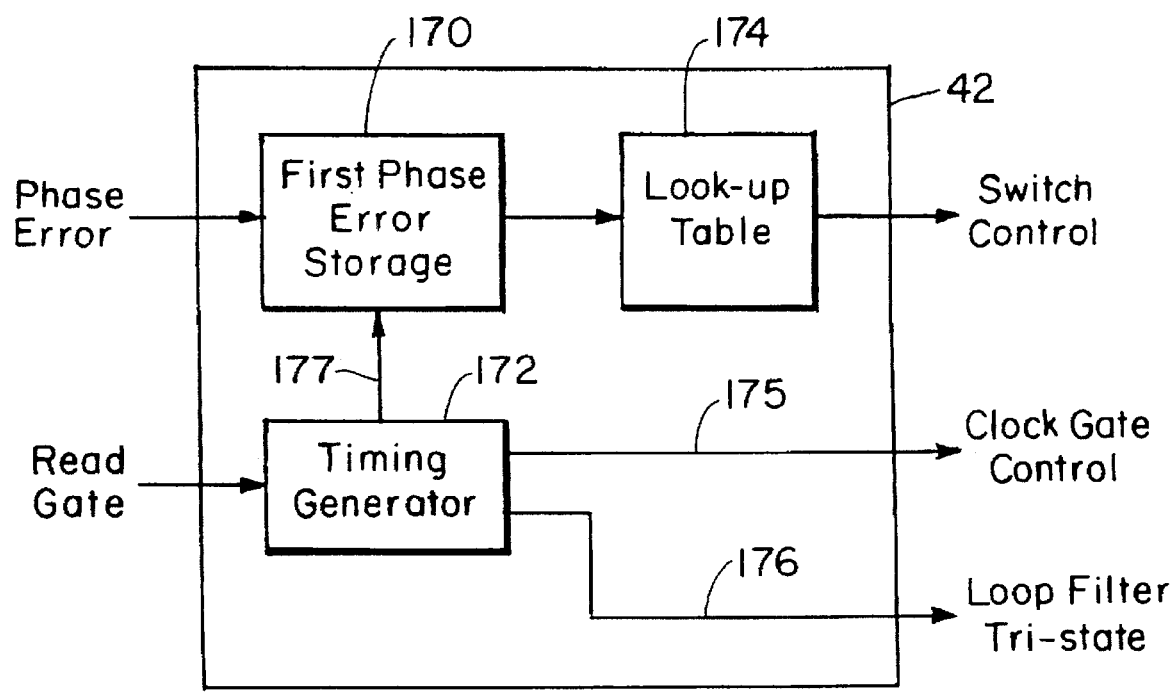
FIG. 5 is a schematic block diagram of the phase selector of FIG. 2.

Phase selector circuit 42 is shown in more detail in FIG. 5 to include first phase error storage block 170, timing generator 172, and look-up table 174. The read gate signal from line 33, FIG. 2, is supplied to timing generator 172 which in turn supplies signals over lines 175 and 176 to gate circuit 43, and loop filter 28 to disable these circuits for the initial phase acquisition mode. In the initial phase acquisition mode, gate circuit 43 prevents the output of VCO 30 from being provided to A/D converter 24 and loop filter 28 is prevented from providing updated average phase error signals to the input of VCO 30.

In addition, timing generator 172 over line 177 enables first phase error storage circuit 170 to receive the first phase error signal output from phase detector 26. This phase error signal is provided to look-up table 174 which outputs a delay tap adjustment signal corresponding to the phase error signal, as described above with regard to FIG. 4, to cause delay tap selector 82 to make the appropriate tap change to adjust the phase of the output of VCO 30 to be within a nominal amount of the desired sampling phase. After this initial tap adjustment is made gate circuit 43 is enabled to provide the output of VCO 30 to A/D converter 24, loop filter 28 is enabled so that it provides its output to VCO 30 and the first phase error storage block 170 is prevented from receiving phase error signals from phase detector 26 until the next enable signal over the read gate line is supplied to the timing generator 172.

Figure 6:
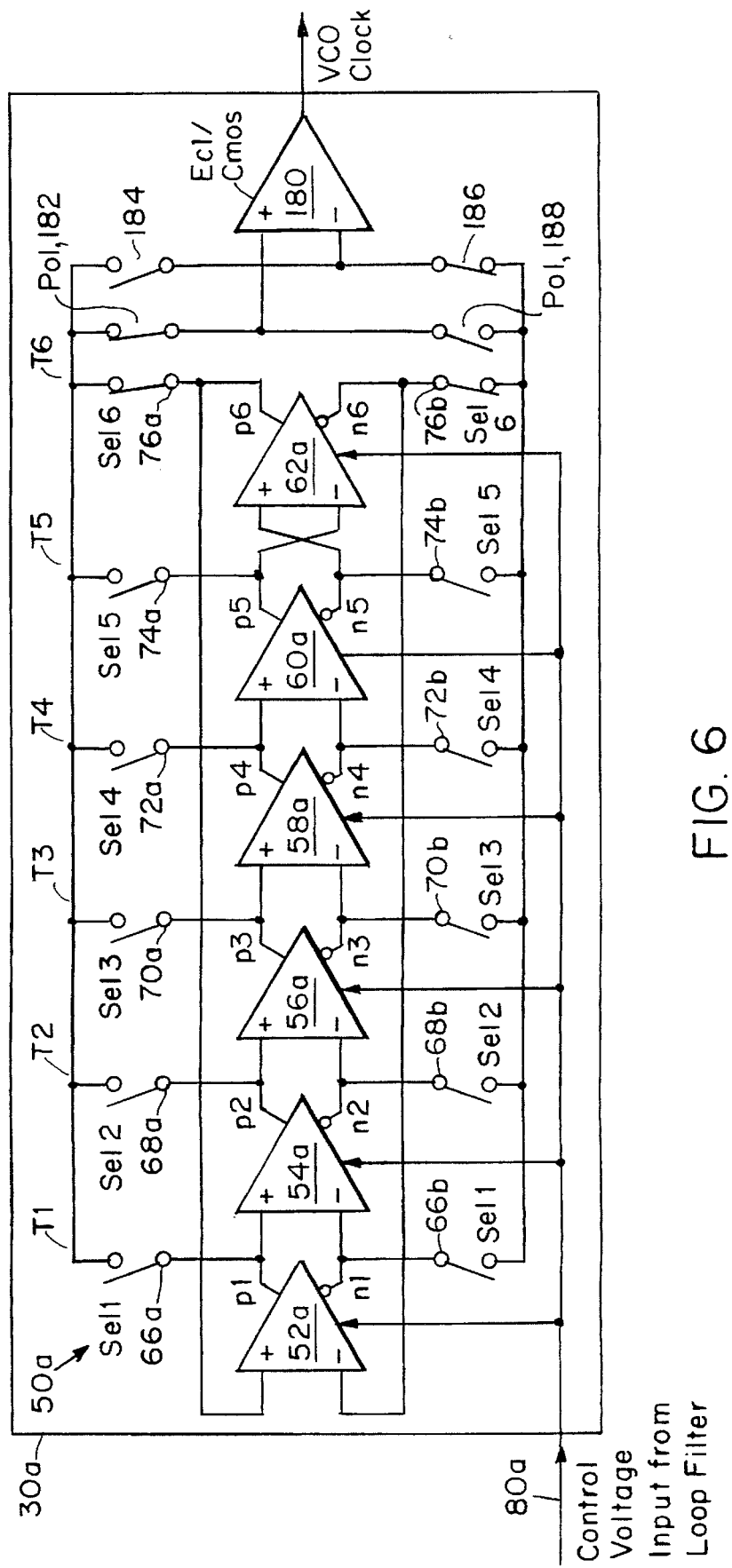
FIG. 6 is a more detailed schematic diagram of an alternative VCO of FIG. 2.

A more detailed schematic diagram of an alternative VCO 30a is shown in FIG. 6. Here delay line oscillator 50a includes delay blocks 52a, 54a, 56a, 58a, 60a and 62a. Which are cascaded in a known manner. The connection between delay block 60 and 62 is slightly different in that the negative output of delay block 60 is provided to the positive terminal of delay block 62, whereas the positive output of delay block 60 is provided to the negative terminal of delay block 62. This provides the signal inversion necessary to keep the delay loop operating. In FIG. 3 an inverter 64 was used for the same purpose.

Delay line oscillator 50a includes delay taps 66, 68, 70, 72, 74 and 76 which each include a positive and negative tap switch, e.g. 66a and 66b. When any one tap is selected both the positive and negative tap switches are closed, and the remaining switches are opened. The initial tap selected is tap T6 (76a, 76b) with a positive polarity. When, as described above, a delay tap adjustment signal from phase selector 42 in response to a negative phase error signal is provided, for example, to change the tap selection from tap T6 to tap T4 to the right effecting a positive (late) phase shift of 120°, taps 76a and 76b are opened while taps 72a and 72b are closed. Since this is a positive phase shift tap switch 72a connected to the positive output of delay block 58a is connected to the positive terminal of amplifier 180 by closing polarity switch 182 and opening polarity switch 184. The negative output of delay block 58 is provided to the negative terminal of amplifier 180 by closing polarity switch 186 and opening polarity switch 188. Amplifier 180 acts as logic level translator. That is, it amplifies voltage level outputs from VCO 30a from about 1 volt to approximately 5 volts.

In contrast, when a delay tap adjustment signal from phase selector 42 in response to a positive phase error signal is provided, for example, to change the tap selection from tap T6 to tap T4 to the left effecting a negative (early) phase shift of 60°, taps 76a and 76b are open while tap 72a and 72b are closed. Since this is a negative phase shift, tap switch 72a connected to the positive output of delay block 58a is connected to the negative terminal of amplifier 180 by opening polarity switch 182 and closing polarity switch 184. The negative output of delay block 58 is provided to the positive terminal of amplifier 180 by opening polarity switch 186 and closing polarity switch 188.

The control voltage input over line 80a from loop filter 28 adjusts the output of the delay blocks 52a–62a in a known manner to fine tune the phase output of VCO 30a after the initial phase acquisition and tap adjustment.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A dynamic phase selector phase locked loop circuit comprising:

an A/D converter for receiving an input to be sampled;

a phase detection circuit for determining the phase error between the sampled input signal and a clock signal;

a clock circuit, responsive to said phase detection circuit, for providing said clock signal to said A/D converter for timing the sampling of the input signal; said clock circuit including a delay circuit having a number of delay taps; and a phase selector circuit, responsive to said phase detection circuit, for initially gating the clock signals to said A/D converter from said clock circuit, and enabling one of said delay taps to dynamically adjust the phase of the clock signal and reduce the initial phase error.

2. The dynamic phase selector phase locked loop circuit of claim 1 in which said phase detection circuit includes a phase detector and a loop filter.

3. The dynamic phase selector phase locked loop circuit of claim 1 in which said clock circuit is a voltage controlled oscillator.

4. The dynamic phase selector phase locked loop circuit of claim 1 in which said delay circuit includes a total of 180° delay.

5. The dynamic phase selector phase locked loop circuit of claim 1 in which said delay circuit includes a number of equal delay segments.

6. The dynamic phase selector phase locked loop circuit of claim 5 in which there are six delay segments with six taps spaced at 30° delay intervals.

7. The dynamic phase selector phase locked loop circuit of claim 1 in which said phase selector circuit includes a gate circuit for gating the clock signals to said A/D converter.

8. The dynamic phase selector phase locked loop circuit of claim 1 in which said phase selector circuit includes a first phase error storage circuit for storing the phase error by said phase detection circuit when said clock signals are initially gated to said A/D converter.

9. The dynamic phase selector phase locked loop circuit of claim 8 in which said phase selector circuit includes a switching circuit responsive to said first phase error storage circuit for enabling one of said delay taps in said delay circuit to adjust the phase of the clock signal and reduce the initial phase error.

10. The dynamic phase selector phase locked loop circuit of claim 9 in which said switching circuit includes a look-up table circuit.

11. The dynamic phase selector phase locked loop circuit of claim 7 in which said phase selector circuit includes a timing generator for enabling said gate circuit to disable the output of said phase detector to said clock circuit.

* * * * *